(12) United States Patent
Yoshimoto

(10) Patent No.: US 7,995,180 B2
(45) Date of Patent: Aug. 9, 2011

(54) METHOD FOR MANUFACTURING LIQUID CRYSTAL DISPLAY DEVICE COMPRISING A CROSSING PORTION CONNECTING LINE AND A LIGHT TRANSMISSION TYPE PHOTOSENSITIVE RESIN HAVING OPENINGS

(75) Inventor: Yoshikazu Yoshimoto, Sendai (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/886,635

(22) Filed: Sep. 21, 2010

(65) Prior Publication Data

US 2011/0014841 A1    Jan. 20, 2011

Related U.S. Application Data

(62) Division of application No. 11/375,072, filed on Mar. 15, 2006, now Pat. No. 7,821,604.

(30) Foreign Application Priority Data

Mar. 15, 2005 (JP) ................................. 2005-073030
Dec. 14, 2005 (JP) ................................. 2005-360166

(51) Int. Cl.
  *G02F 1/1333* (2006.01)
  *G02F 1/1343* (2006.01)
(52) U.S. Cl. ........................................ 349/138; 349/139
(58) Field of Classification Search ........... 349/138–139
  See application file for complete search history.

(56) References Cited

U.S. PATENT DOCUMENTS

| 6,084,258 | A | 7/2000 | Tokushima | |
|---|---|---|---|---|
| 6,717,634 | B2 * | 4/2004 | Kim et al. | 349/54 |
| 6,794,231 | B2 | 9/2004 | Tokuhiro et al. | |
| 7,098,971 | B2 * | 8/2006 | Oh et al. | 349/47 |
| 7,372,513 | B2 | 5/2008 | Choi | |
| 2001/0040649 | A1 | 11/2001 | Ozaki | |

FOREIGN PATENT DOCUMENTS

| JP | 09-265113 | 10/1997 |
|---|---|---|
| JP | 2003-318193 | 11/2003 |
| JP | 2006-251120 | 9/2006 |

* cited by examiner

*Primary Examiner* — Mark A Robinson
*Assistant Examiner* — Charles Chang
(74) *Attorney, Agent, or Firm* — Antonelli, Terry, Stout & Kraus, LLP.

(57) ABSTRACT

The present invention provides a method for manufacturing a liquid crystal display device. In openings of a first light transmission type photosensitive resin formed on an insulating substrate, a gate electrode, a source line, and a pixel contact layer are prepared. On these components, a gate insulator, a semiconductor layer, an ohmic contact layer (n+ semiconductor layer) and a protective film are prepared. Further, in openings of a second light transmission type photosensitive resin, a source electrode, a drain electrode, and a pixel electrode are prepared. Also, the crossing portion connecting line formed at the opening of the second light transmission type photosensitive resin is, similarly to the source line or the gate line, made of baked silver produced by baking an ink containing silver fine particles plotted by ink jet process.

4 Claims, 12 Drawing Sheets

METHOD FOR MANUFACTURING LIQUID CRYSTAL DISPLAY DEVICE COMPRISING A CROSSING PORTION CONNECTING LINE AND A LIGHT TRANSMISSION TYPE PHOTOSENSITIVE RESIN HAVING OPENINGS

CLAIM OF PRIORITY

This application is a divisional of application Ser. No. 11/375,072, filed on Mar. 15, 2006, now U.S. Pat. No. 7,821,604, which claims the benefit of Japanese Application No. JP 2005-073030, filed Mar. 15, 2005 and JP 2005-360166, filed Dec. 14, 2005 in the Japanese Patent Office, the disclosures of which are incorporated herein by reference.

FIELD OF THE INVENTION

The present invention relates to a liquid crystal display device using a thin-film transistor with a gate electrode, a source electrode, and a drain electrode prepared by ink jet plotting. The invention also relates to a method for manufacturing the same.

BACKGROUND OF THE INVENTION

A thin-film transistor (TFT) used in a liquid crystal display device of active matrix type comprises a gate electrode with metal film such as chromium, a gate insulator film made of SiNx, a semiconductor layer made of amorphous silicon, an ohmic contact layer doped with impurities such as phosphor, a source electrode and a drain electrode made of metal film such as chromium, and a protective film laminated in this order on a substrate.

The thin-film transistor as given above is produced by preparing a multiple of thin films on a glass substrate and by performing photo-lithographic process on the thin films. However, for preparing the thin films and for patterning, expensive and low-throughput vacuum systems with complicated structure such as sputtering system, CVD system and etching system must be used. This makes the manufacturing process more complicated and requires higher manufacturing cost.

In this respect, the Patented Reference 1 as given below discloses the manufacture of a thin-film transistor in an atmospheric condition as much as possible. This Patented Reference 1 describes that a gate electrode film of thin-film transistor is produced by ink jet procedure using a liquid material containing a conductive material and to form a source area and a drain area of the thin-film transistor by using a liquid material containing a semiconductor material coated by ink jet procedure.

Also, the Patented Reference 2 describes means to reduce the photo-lithographic process and to simplify the production process, in which a gate bus line and a source bus line are formed on the same layer, and the source bus line being cut off at the crossing portion is bridged in the layer of pixel electrode when the pixel electrode is prepared.
[Patented Reference 1] JP-A-2003-318193
[Patented Reference 2] JP-A-1997-265113

In the manufacture of the thin-film transistor as described in the Patented Reference 1, it is described that the number of the vacuum systems needed is reduced and production processes are simplified by introducing the ink jet procedure. However, many production processes are still required, and it is not possible to manufacture the thin-film transistors at low cost and with high throughput.

According to the method described in the Patented Reference 2, a transparent electrode material with high specific resistance such as indium tin oxide (ITO) (specific resistance: 100 to 1000 $\mu\Omega\cdot cm$) is used as pixel electrode. As a result, high resistance develops at cross-linking portion to connect the source line.

Normally, a metal material with specific resistance of less than 3 $\mu\Omega\cdot cm$ is used as the bus line. However, even when the length of the bridged portion is designed to be about 5% to 1% of the length of the bus line, the resistance of the bus line is as high as 1.3 to 3 times. It is practically impossible to design the length of the bridged portion to 5% or lower. Further, contact resistance develops between the metal of the bus line with lower specific resistance and ITO with high specific resistance, and this further increases contact resistance at the cross-linking portion.

For large-scale production of high-precision panel for LCD-TV of 100-inch class to be used in the future, the manufacturing method cannot be used, in which wiring resistance is increased even by 1%.

In this respect, it is an object of the present invention to provide a liquid crystal display device using a thin-film transistor and a method for manufacturing the same, by which it is possible to simplify the production process and to reduce the wiring resistance without increasing wiring resistance of the source line and the gate line.

SUMMARY OF THE INVENTION

Auxiliary capacity lines except the source line and the gate line of the thin-film transistor and the pixel contact layer and the crossing portion connecting line are formed at the same time in openings of a first light transmission type photosensitive resin by ink jet procedure using an ink containing metal fine particles.

In the opening of a second light transmission type photosensitive resin, a source electrode and a drain electrode of thin-film transistor and a pixel electrode and a crossing portion connecting line are formed at the same time by ink jet procedure using different types of ink.

In particular, to the crossing portion connecting line, the source line or the gate line is connected by using an ink containing the same type of metal fine particles as that of the source line or the gate line.

Because the ink jet plotting process is used, no expensive vacuum system (such as sputtering system and metal etching system) is required and the production cost can be reduced. Also, the number of the production processes is extensively reduced, and it is possible to decrease the production cost to a great extent. Also, through extensive reduction of procedures, on-demand type production without requiring inventory can be achieved.

Different types of line patterning can be performed by ink jet plotting at the same time using a photo mask. Patterning can be carried out by using the light transmission type photosensitive resin. The light transmission type photosensitive resin thus patterned can be used for ink jet plotting lines and also can be used as etching mask.

In particular, for the crossing portion connecting lines to be formed in the opening of the second light transmission type photosensitive resin, an ink containing the same type of metal fine particles as that of the source line or gate line is used. Thus, wiring resistance is not increased even when very few masks are used.

Further, the thin-film transistor (TFT) array and the method for manufacturing the same have not been known in the past,

DETAILED DESCRIPTION OF THE PREFERRED EMBODIMENTS

Figure 1:
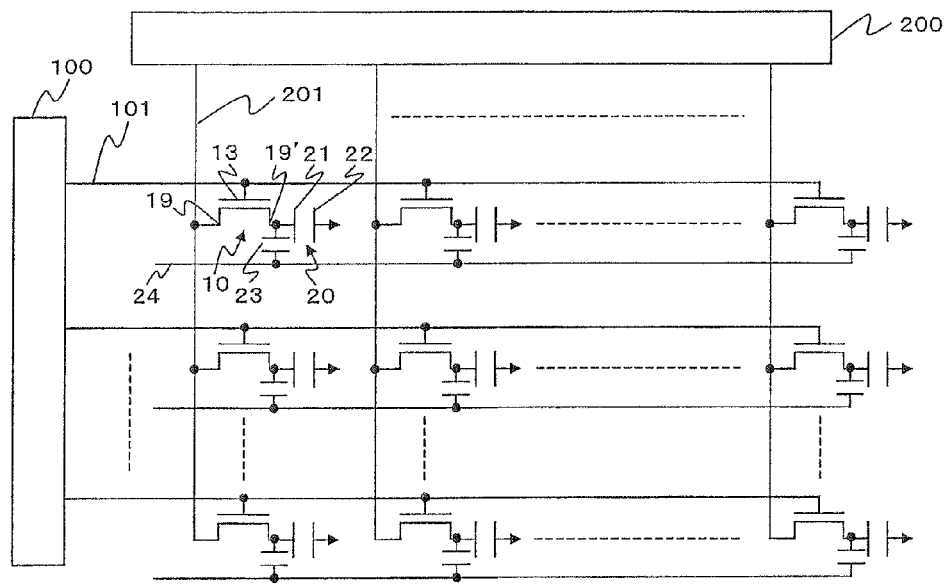
FIG. 1 is a schematical diagram of a liquid crystal display device according to the present invention.

Description will be given below on embodiments of the present invention referring to the drawings.

Embodiment 1

FIG. 1 is a schematical diagram of a liquid crystal display device of active matrix type using a thin-film transistor according to the present invention. To match scan lines 101 as selected by a scan line driving circuit 100, data (voltage) is supplied to a thin-film transistor 10 from a data line driving circuit 200 via data lines 201.

The thin-film transistor 10 is provided at an intersection of the scan line 101 and the data line 201. The scan line 101 is connected to a gate electrode 13 of the thin-film transistor 10. The data line 201 is connected to a source electrode 19 of the thin-film transistor 10.

A drain electrode 19' of the thin-film transistor 10 is connected to a pixel electrode 21 of a liquid crystal element 20. The liquid crystal element 20 is positioned between the pixel electrode 21 and a common electrode 22, and it is driven by data (voltage) supplied to the pixel electrode 21. An auxiliary capacity 23 to temporarily maintain the data (voltage) is connected between the drain electrode 19' and an auxiliary capacity line 24.

Figure 2:
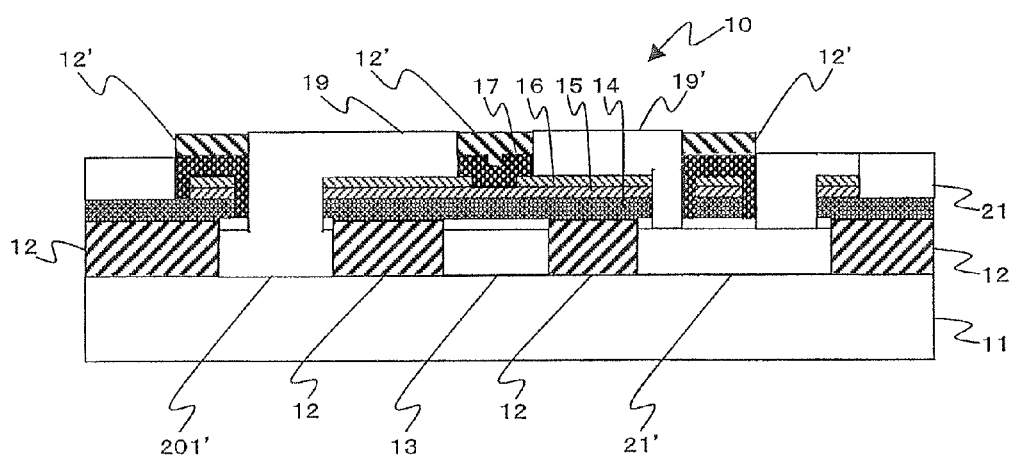
FIG. 2 is a cross-sectional view of a thin-film transistor of the present invention.

FIG. 2 is a cross-sectional view of the thin-film transistor 10 provided in matrix arrangement shown in FIG. 1. A source line 201', the gate electrode 13 and a pixel contact layer 21' are prepared in openings of a first light transmission type photosensitive resin 12 formed on an insulating substrate (glass substrate) 11 by ink jet plotting using an ink containing metal fine particles.

Also, a source electrode 19, a drain electrode 19' and the pixel electrode 21 are formed in openings of a second light transmission type photosensitive resin 12' prepared in the last process by ink jet plotting using an ink containing metal fine particles.

Reference numeral 14 denotes a gate insulator film, numeral 15 denotes a semiconductor layer, numeral 16 represents an n⁺ semiconductor layer (ohmic contact layer), and numeral 17 represents a protective film.

Figure 3A:
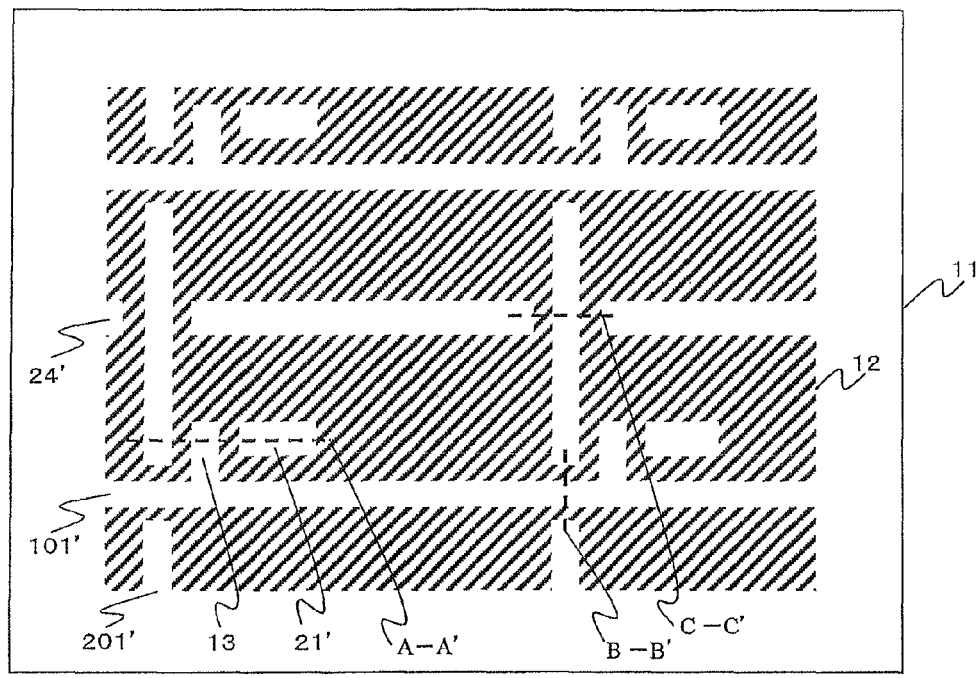
FIG. 3 represents drawings to show processes to prepare gate lines and source lines of the thin-film transistor shown in FIG. 2.
Figure 3B:
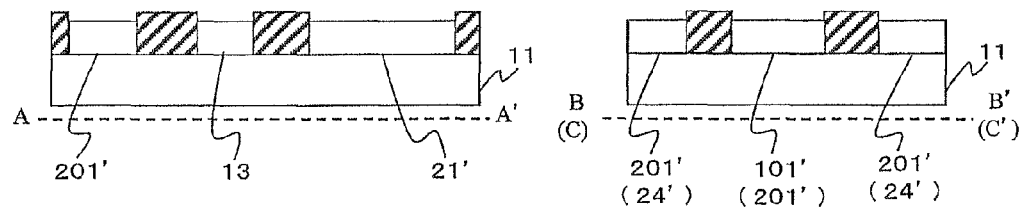
Figure 3C:
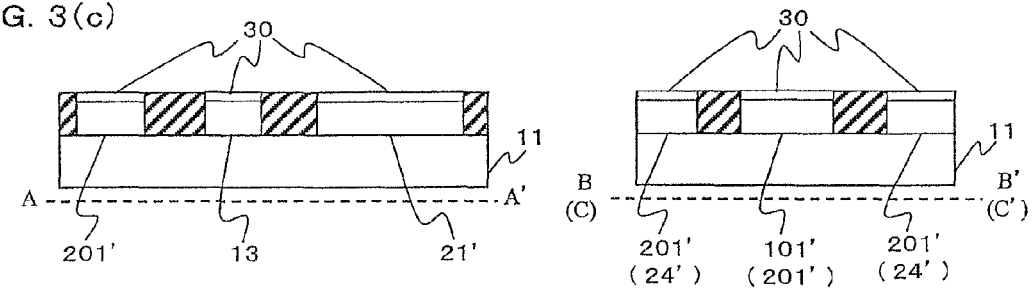
Figure 4A:
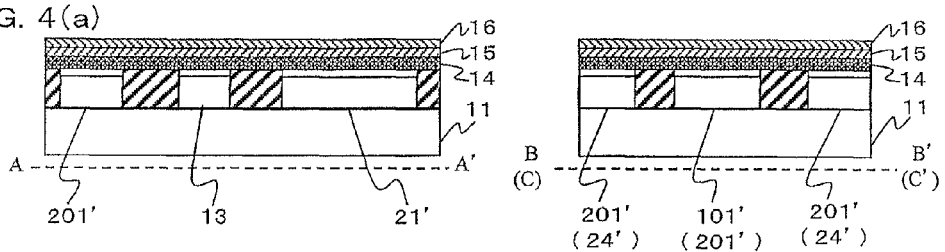
FIG. 4 represents drawings to show processes to prepare the thin-film transistor subsequent to those of FIG. 3.
Figure 4B:
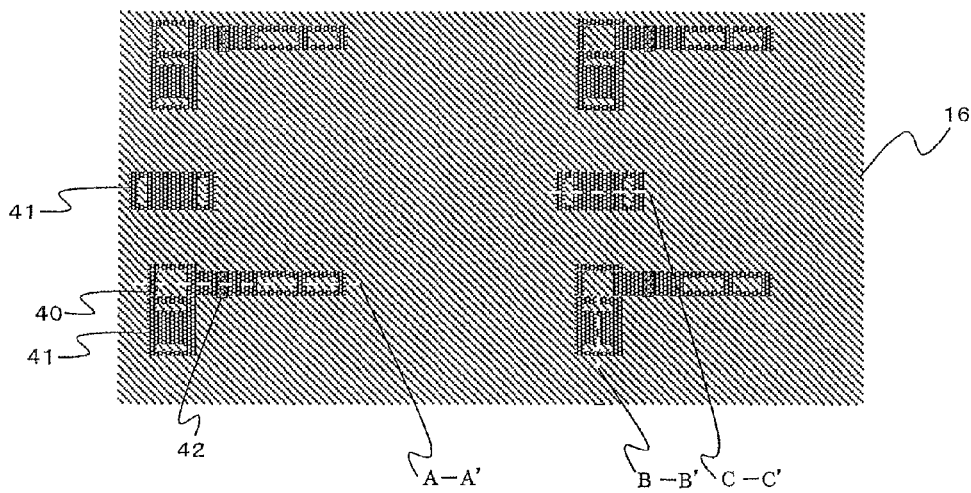
Figure 4C:
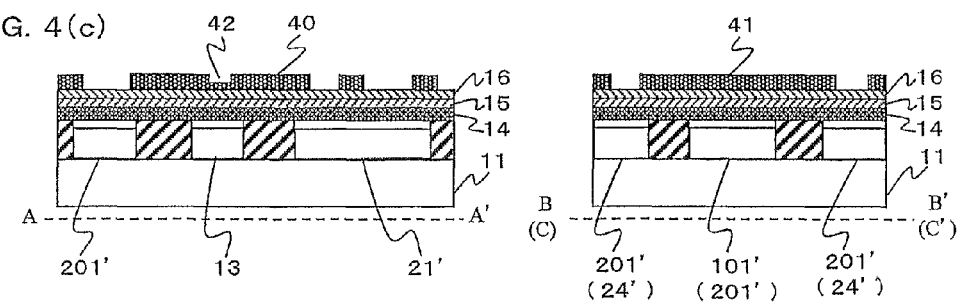
Figure 4D:
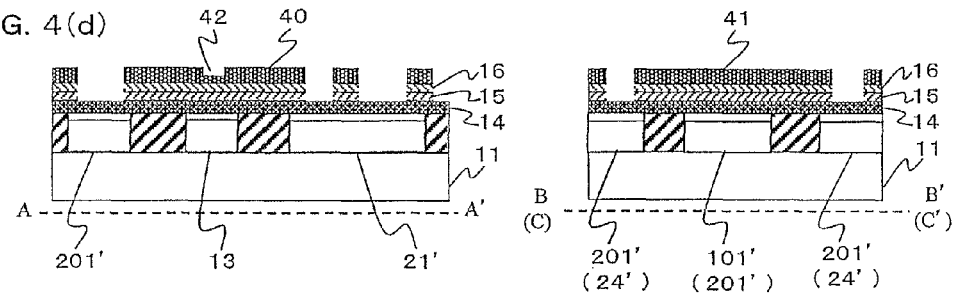
Figure 5A:
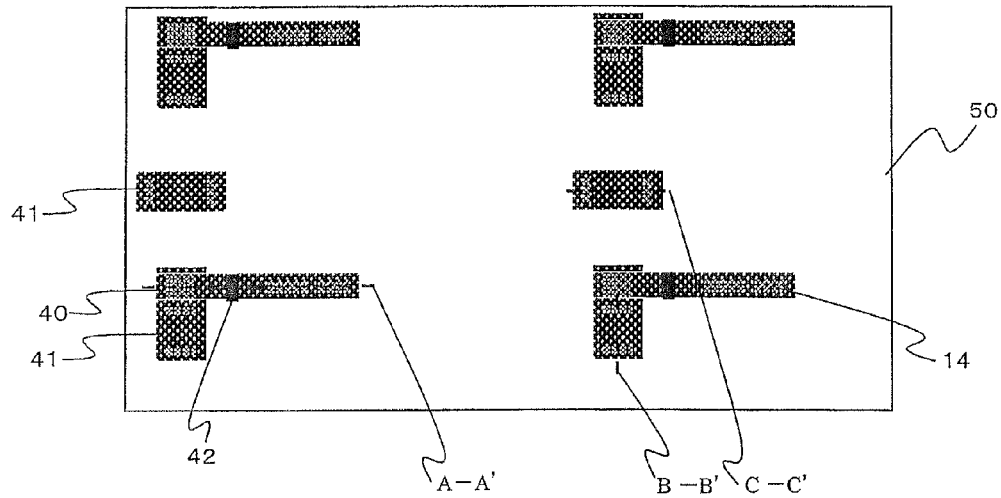
FIG. 5 represents drawings to show processes to prepare the thin-film transistor subsequent to those of FIG. 4.
Figure 5B:
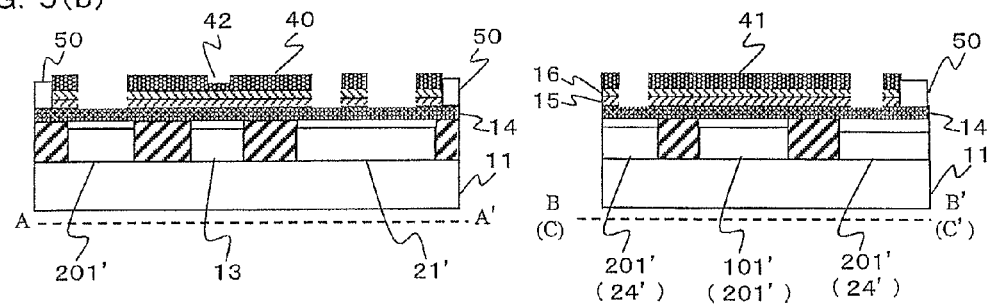
Figure 5C:
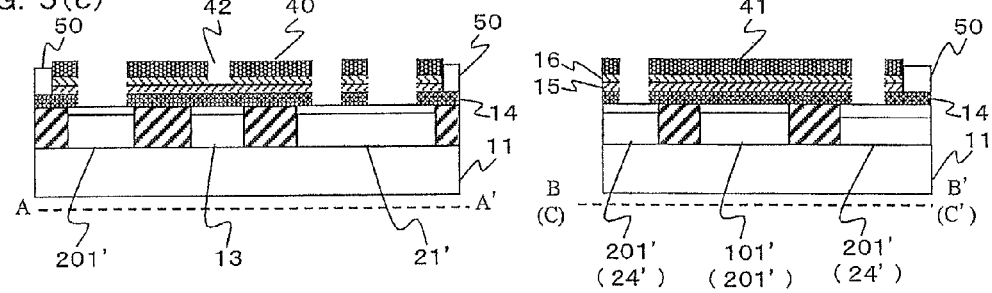
Figure 5D:
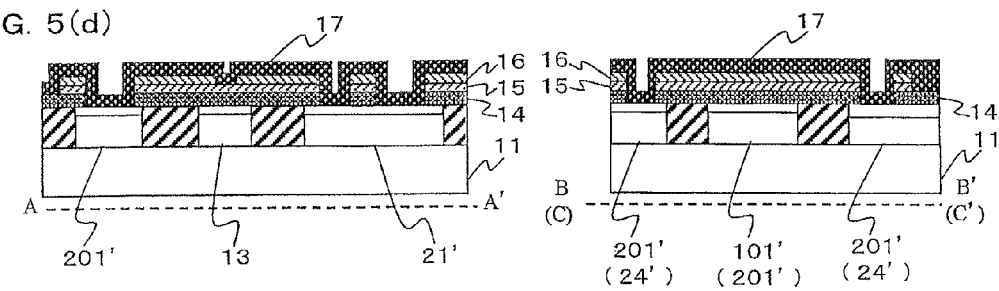
Figure 6A:
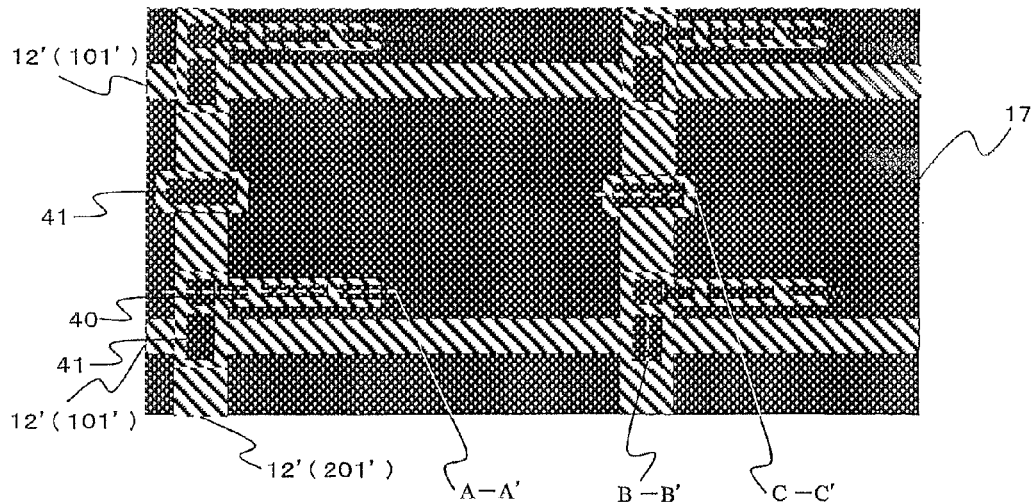
FIG. 6 represents drawings to show processes to prepare pixels subsequent to those of FIG. 5.
Figure 6B:
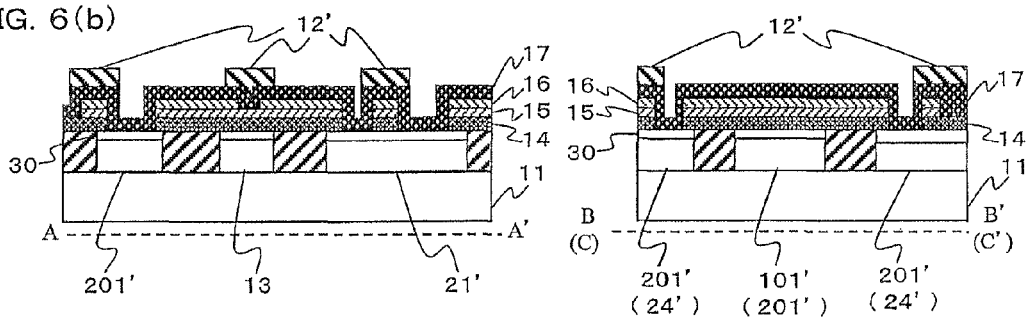
Figure 6C:
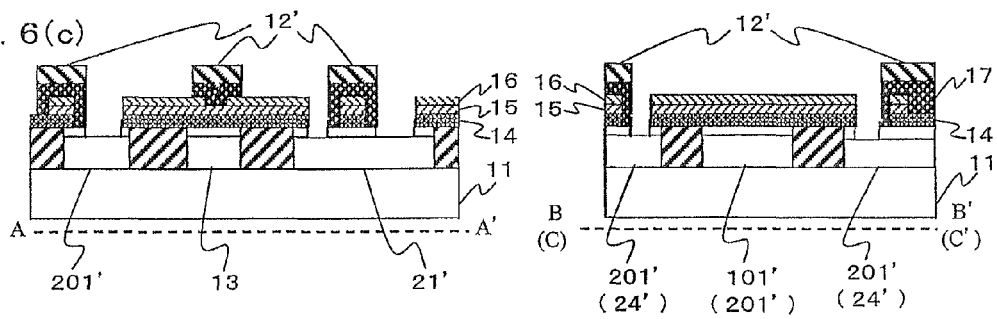
Figure 6D:
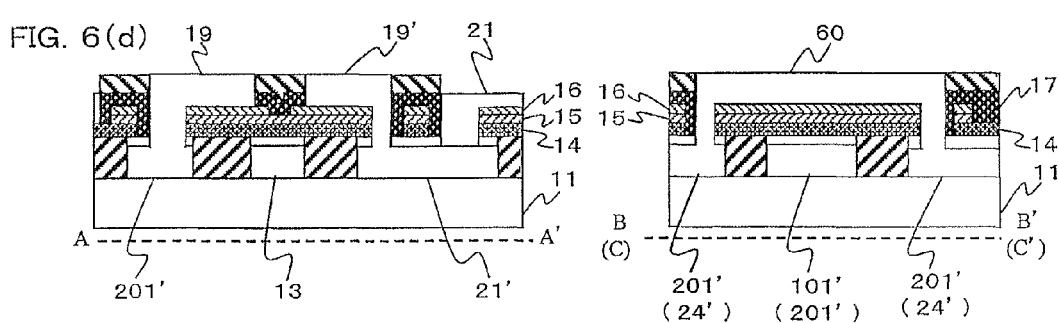

FIG. 3 represents drawings to show processes for preparing gate-source lines for the thin-film transistor 10 as shown in FIG. 2. First, the first light transmission type photosensitive resin 12 is coated on a rinsed insulating substrate 11. As shown in FIG. 3 (a), the processes of light exposure, developing, and baking are carried out using a first photomask, on which patterned portions (the gate line 101', the source line 201', the auxiliary capacity line 24', the gate electrode 13, and the pixel contact layer 21') is formed.

FIG. 3 (b) and FIG. 3 (c) represents cross-sectional views of the thin-film transistor along a broken line A-A' and of the crossing portion of the bus line along a broken line B-B' and a broken line C-C'. Along the broken line B-B', the gate line 101' is designed to be continuous and the source line 201' is disconnected, while it may be designed in such manner that the gate line 101' is disconnected and the source line 201' is continuous. In this case, the cross-sectional view is the same as the cross-sectional view along the broken line C-C'.

Next, as shown in FIG. 3 (b), all portions except the patterned portion are processed by water-repellent processing and the patterned portion is processed by hydrophilic processing so that the ink containing metal fine particles (silver fine particles) for ink jet plotting is intensively plotted on the patterned portion. Then, the ink containing the metal fine particles on the patterned portion is completely baked. On the auxiliary capacity line 24', a transparent conductive substance (ITO) is coated by ink jet coating.

Finally, as shown in FIG. 3 (c), a cap metal 30 consisting of Ni is placed on the patterned portion. Then, ink is plotted by ink jet process and the ink is completely baked.

FIG. 4 represents drawings to show processes for preparing the thin-film transistor subsequent to those of FIG. 3. As shown in FIG. 4 (a), a gate insulator 14 comprising SiNx, a semiconductor film (semiconductor layer) 15 comprising a-Si, and an n⁺ semiconductor film (ohmic contact layer) 16 are formed one upon another. A cross-sectional view of the photosensitive resin of the thin-film transistor portion 40 along the broken line A-A' is shown in FIG. 4 (b), and cross-sectional views along the broken lines B-B' and C-C' of a crossing portion 41 of the line is also shown.

Next, a resist is coated, and as shown in FIG. 4 (b), the resist is exposed to light and developed by using an island pattern mask to form the resin of the thin-film transistor 40 portion and the resin of crossing portion 41 of the line in island-like shape. Half-exposure portion 42 of the resin is performed on the gate electrode 13 of the thin-film transistor. FIG. 4 (c) is a cross-sectional view after the development of the resist. FIG. 4 (c) and FIG. 4 (d) represents cross-sectional views of the resin of the thin-film transistor portion 40 along the broken line A-A' and of the crossing portion 41 along the broken lines B-B' and C-C'.

Finally, as shown in FIG. 4 (d), dry etching is carried out on the n⁺ semiconductor film 16 and the semiconductor film 15.

Further, FIG. 5 represents drawings to show processes for preparing the thin-film transistor subsequent to those of FIG. 4. As shown in the plan view of FIG. 5 (a) and in the cross-sectional view of FIG. 5 (b), a resist 50 is prepared by ink jet plotting around the thin-film transistor 40 prepared in island-like shape and around the crossing portion 41 of the line. FIG. 5 (*b*), FIG. 5 (*c*), and FIG. 5 (*d*) each represent a cross-sectional view of the thin-film transistor 40 along the broken line A-A' and cross-sectional views of the crossing portion 41 of the line along the broken line B-B' and the broken line C-C'.

Next, as shown in FIG. 5 (*c*), the gate insulator 14 is processed by dry etching (cap ash) using $CF_4/O_2$. The half-exposed portion 42 is removed, and the $n^+$ semiconductor film 16 on the half-exposed portion 42 is processed by dry etching using $SF_6/Cl_2$.

Finally, as shown in FIG. 5 (*d*), the resist 50 is removed off, and a protective film 17 comprising SiNx is prepared.

FIG. 6 represents drawings to show processes for preparing pixel subsequent to those of FIG. 5. First, the second light transmission type photosensitive resin 12' is coated. Then, the processes of light exposure, development, and baking are performed using a second photomask with a patterned portion on it (a gate line 101', a source line 201', a thin-film transistor 40, and a crossing portion 41) as shown in FIG. 6 (*a*). FIG. 6 (*b*), FIG. 6 (*c*), and FIG. 6 (*d*) each represents a cross-sectional view of the thin-film transistor 40 along the broken line A-A', and a cross-sectional view of the crossing portion 41 along the line broken lines B-B' and C-C'.

Figure 7:
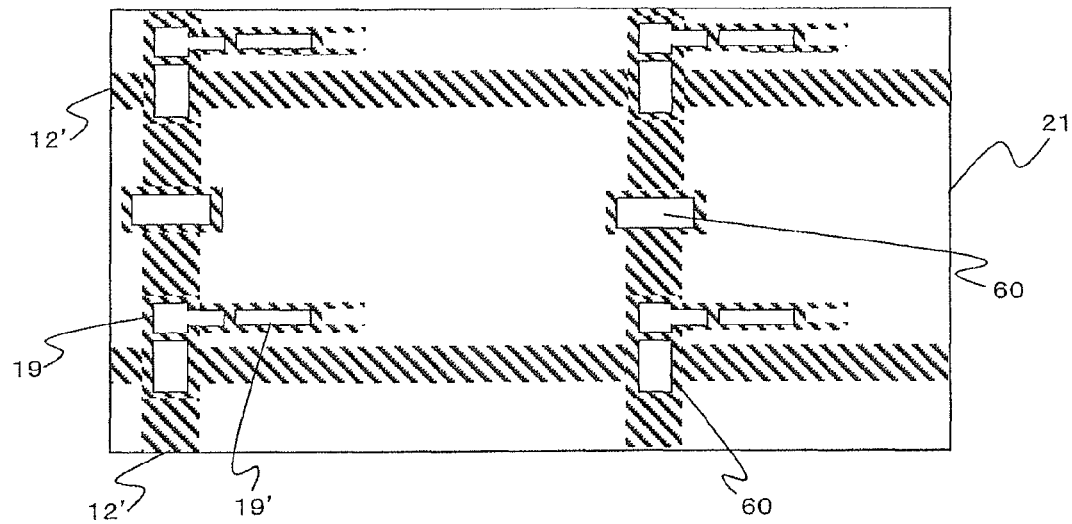
FIG. 7 is a plan view of the thin-film transistor prepared as shown in FIG. 3 to FIG. 6.

Next, as shown in FIG. 6 (*c*), the protective film 17 and the cap metal 30 are processed by etching. Then, as shown in FIG. 6 (*d*), a source electrode 19, a drain electrode 19', a pixel electrode 21, and a crossing portion connecting line 60 are prepared by ink jet coating, and complete baking is carried out. A low-resistance barrier metal is used as the source electrode 19 and the drain electrode 19'. The pixel electrode 21 is made of conductive substance (ITO). Silver fine particles are used for the crossing portion connecting line 60. FIG. 7 shows a plan view.

FIG. 7 is a plan view of the arrangement shown in FIG. 6 (*d*). It is a plan view when the thin-film transistor 10 of FIG. 2 is arranged in matrix-like form as shown in FIG. 1. In openings of a second light transmission type photosensitive resin 12', a source electrode 19, a drain electrode 19', a pixel electrode 21 and a crossing portion connecting line 60 are prepared.

Embodiment 2

Figure 8:
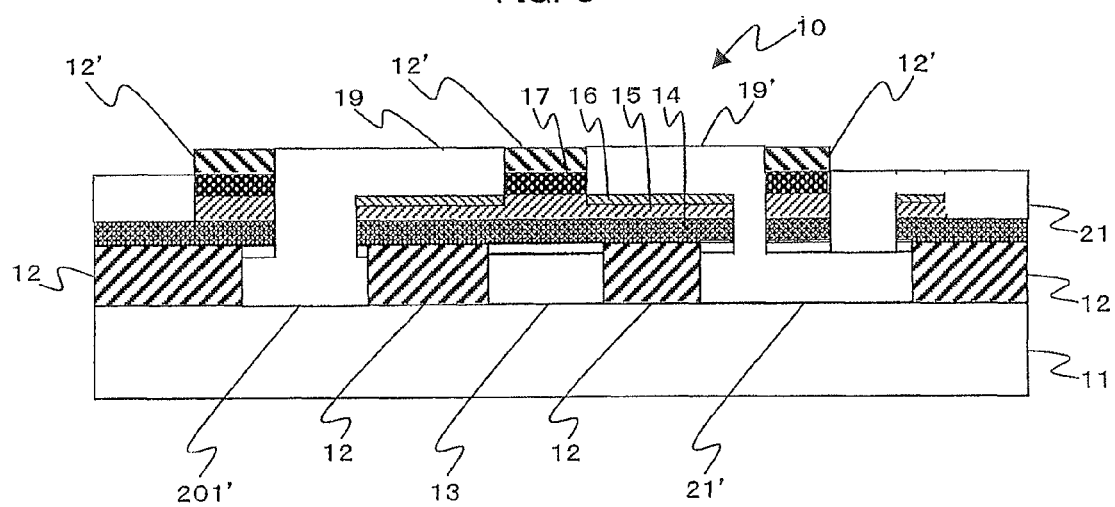
FIG. 8 is a cross-sectional view of another thin-film transistor according to the present invention.

FIG. 8 is a cross-sectional view of the thin-film transistor 10 shown in FIG. 1. It is different from the cross-sectional view of the thin-film transistor 10 of FIG. 2 in the arrangement of the ohmic contact layer ($n^+$ semiconductor layer) 16 and the protective layer 17. Description will be given below on the processes for manufacturing this thin-film transistor. The gate-source line process is the same as the process shown in FIG. 3. The next process for preparing the thin-film transistor is shown in FIG. 9.

Figure 9A:
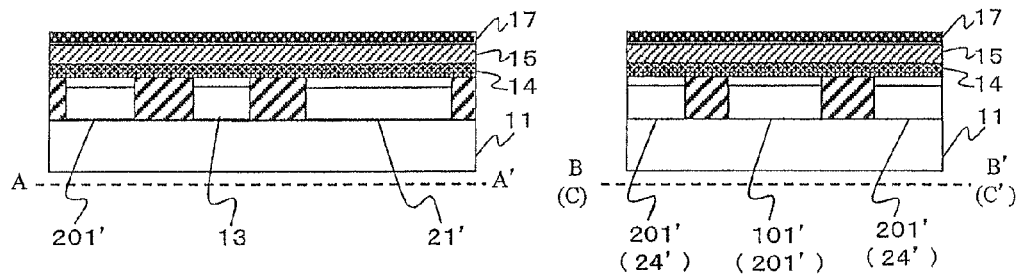
FIG. 9 represents drawings to show processes for preparing the thin-film transistor shown in FIG. 8.
Figure 9B:
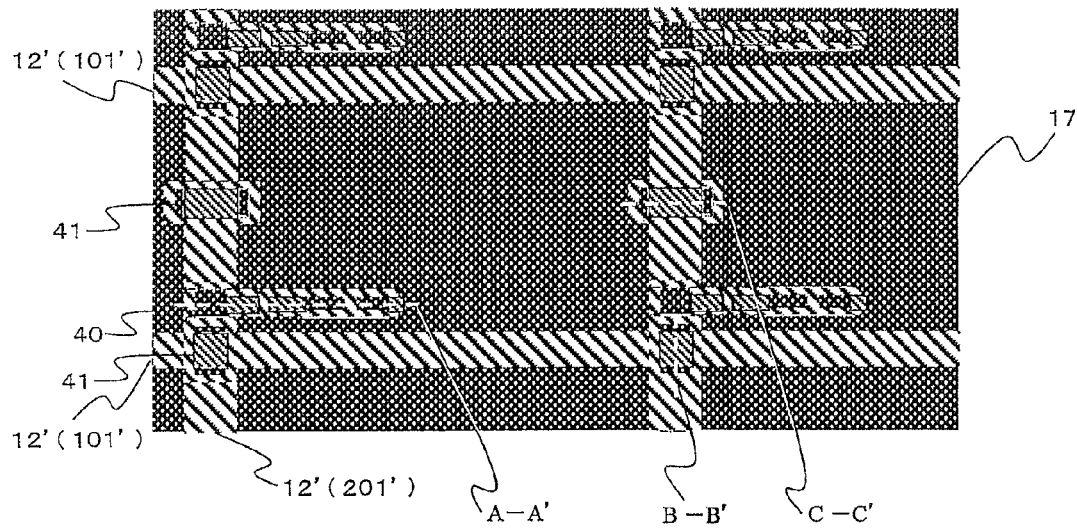
Figure 9C:
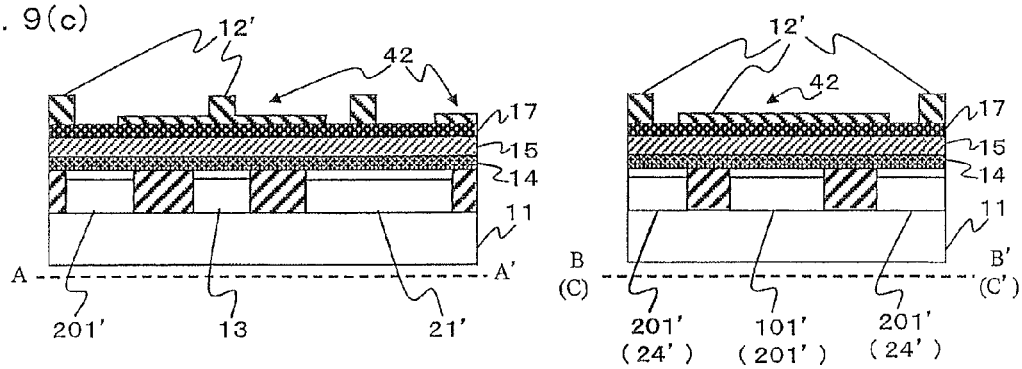
Figure 10A:
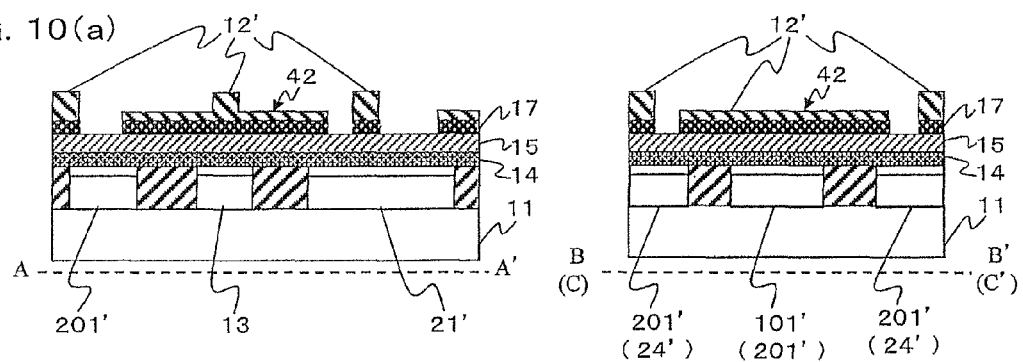
FIG. 10 represents drawings to show processes for preparing the thin-film transistor subsequent to those of FIG. 9.
Figure 10B:
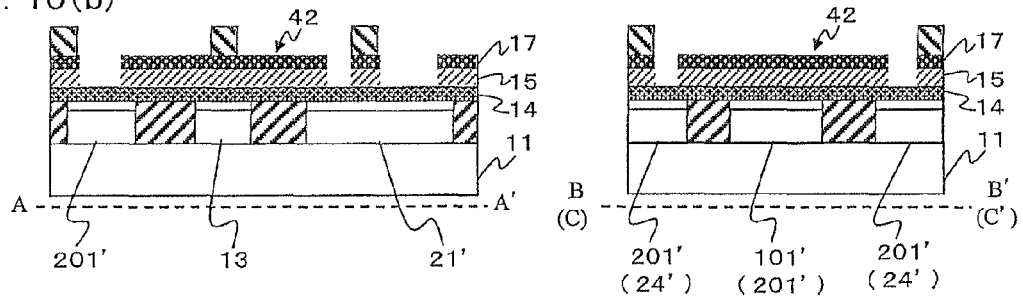
Figure 10C:
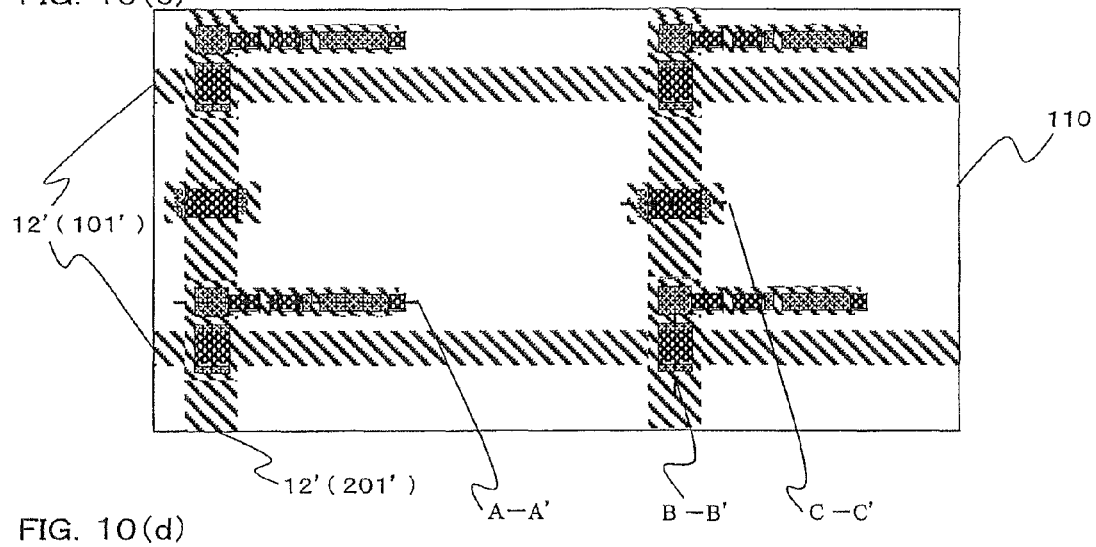
Figure 10D:
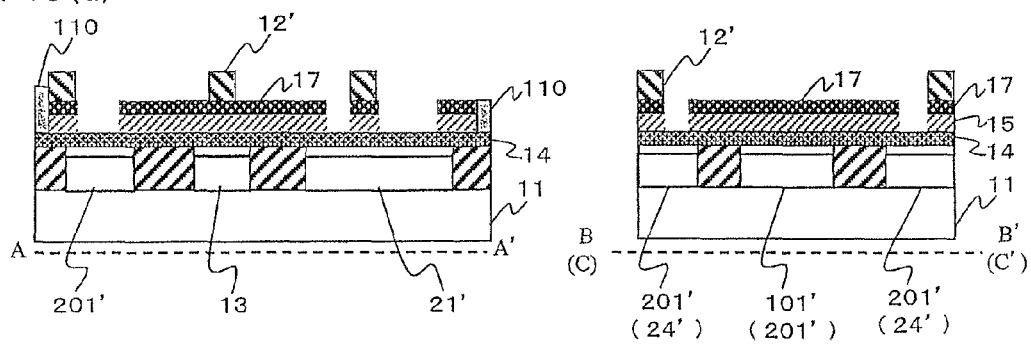
Figure 11A:
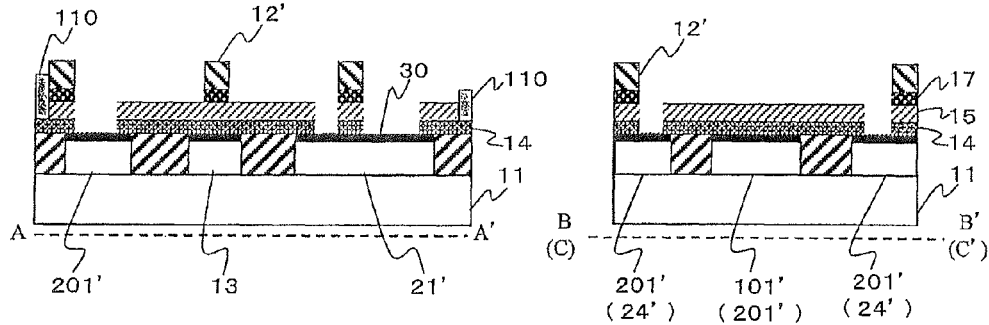
FIG. 11 represents drawings to show processes for preparing the thin-film transistor subsequent to those of FIG. 10.
Figure 11B:
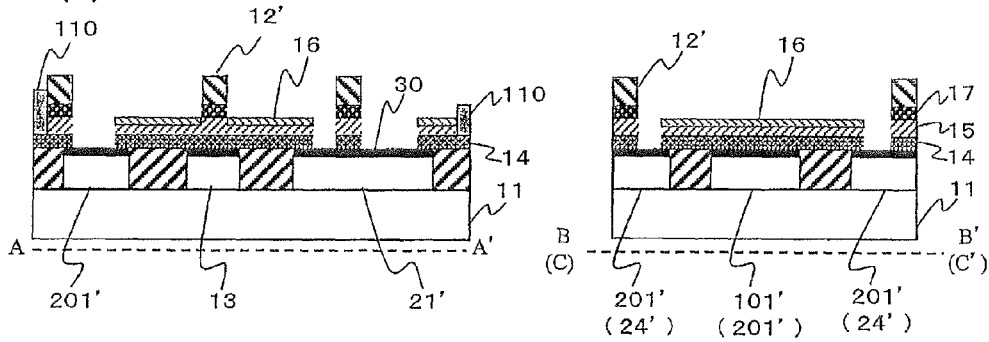
Figure 11C:
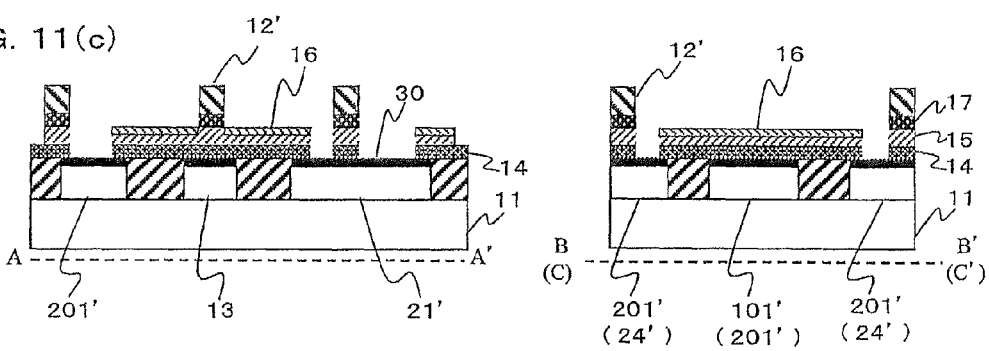
Figure 11D:
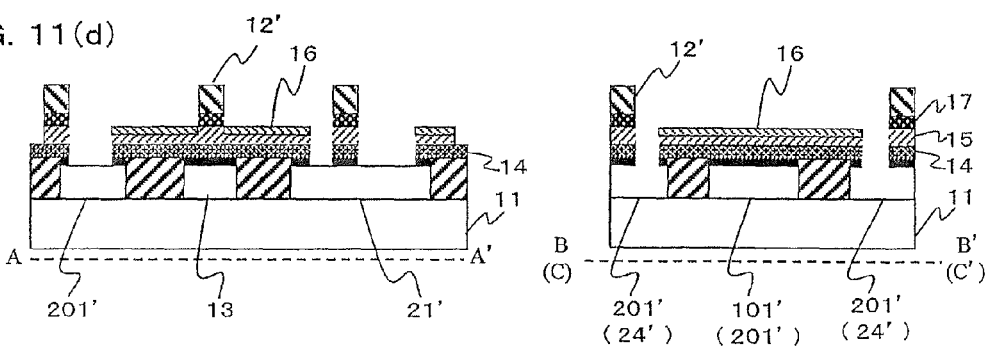

FIG. 9 represents drawings to show processes for preparing the thin-film transistor subsequent to the gate-source line process shown in FIG. 3. As shown in FIG. 9 (*a*), a gate insulator 14, an a-Si semiconductor film 15 and a protective film 17 are sequentially formed. FIG. 9 (*c*) represents a cross-sectional view of the thin-film transistor 40 along the broken line A-A', the line crossing portion 41 along the broken lines B-B' and the broken line C-C'.

Next, similarly to the procedure shown in FIG. 6 (*a*), a second light transmission type photosensitive resin 12' is coated. As shown in FIG. 9 (*b*), the processes of light exposure, development and baking are carried out by using a second photomask to form a thin-film transistor 40 and a line crossing portion 41 in island-like shape on the gate line 101' and on the source line 201'. The thin-film transistor 40 and the line crossing portion 41, and a part of the pixel contact layer 21' as shown in FIG. 9 (*c*) are prepared as half-exposed portions 42.

FIG. 10 represents drawings to show processes for preparing the thin-film transistor subsequent to those of FIG. 9. As shown in FIG. 10 (*a*), the protective film 17 is processed by DHF wet etching or by etching with $CF_4$. Next, as shown in FIG. 10 (*b*), the semiconductor film 15 and the half-exposed portion 42 are processed by dry etching with $SF_6$.

Then, as shown in FIG. 10 (*c*), a resist 110 is prepared by ink jet coating on the area except the thin-film transistor 40 and the line crossing portion 41. FIG. 10 (*d*) is a cross-sectional view.

FIG. 11 represents drawings to show processes for preparing the thin-film transistor subsequent to those of FIG. 10. As shown in FIG. 11 (*a*), a gate insulator 14 and a protective film 17 are processed by dry etching with $CF_4$ or $C_2F_8$. Next, as shown in FIG. 11 (*b*), doping is performed with P ions, and an ohmic contact layer ($n^+$ semiconductor layer) 16 is prepared. Then, as shown in FIG. 11 (*c*), the resist 110 is removed off, and a cap metal 30 is processed by selective etching with DHF as shown in FIG. 11 (*d*).

Figure 12A:
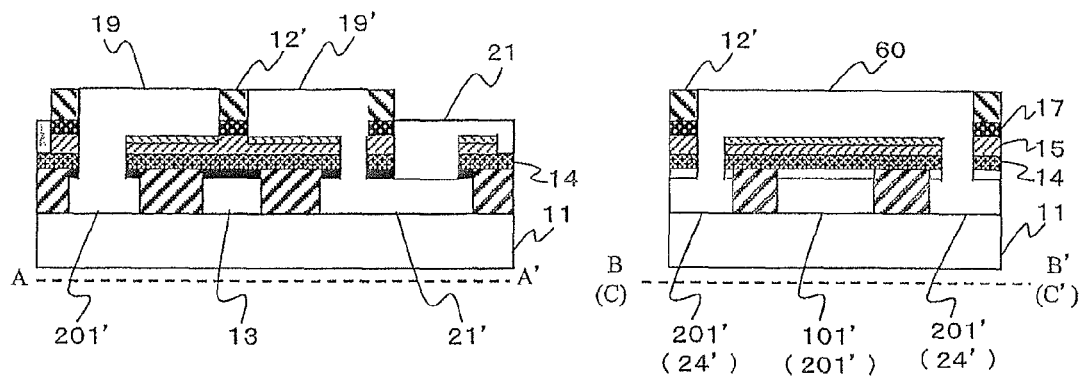
FIG. 12 represents drawings to show processes for preparing the thin-film transistor subsequent to those of FIG. 11 and a plan view of the thin-film transistor.
Figure 12B:
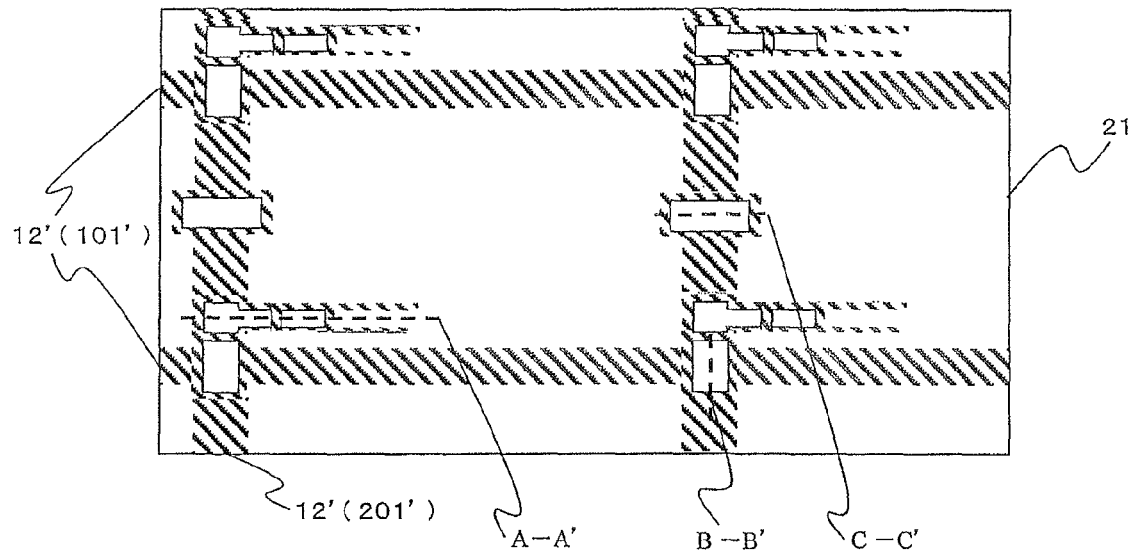

FIG. 12 represents drawings to show processes for preparing the thin-film transistor subsequent to those of FIG. 11 and the process for forming pixel electrode. As shown in FIG. 12 (*a*), a source electrode 19, a drain electrode 19', a pixel electrode 21, and a crossing portion connecting line 60 are prepared by ink jet process. FIG. 12 (*b*) is a plan view.

Embodiment 3

Figure 13:
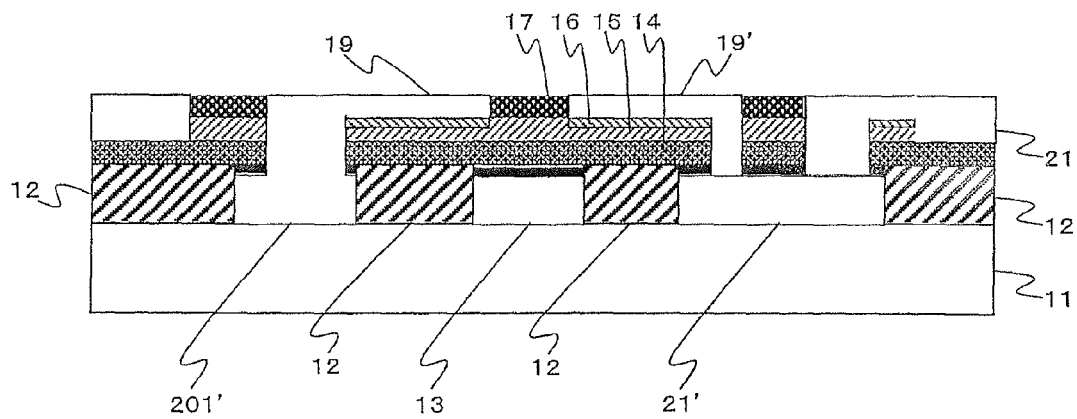
FIG. 13 is a cross-sectional view of still another thin-film transistor according to the present invention.
Figure 14A:
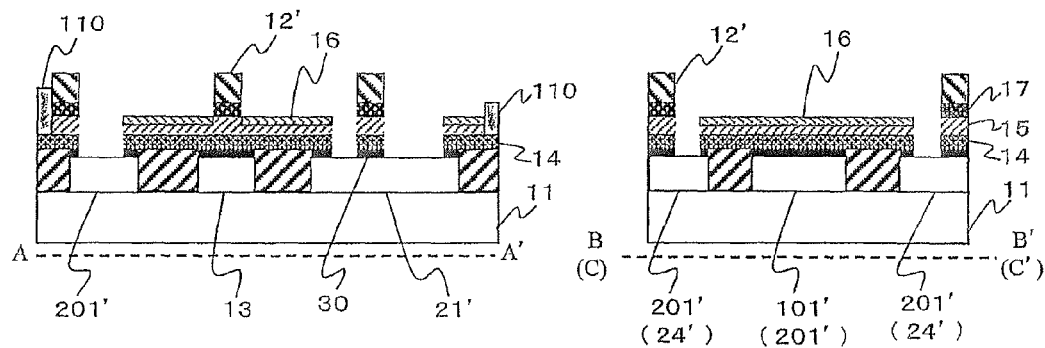
FIG. 14 represents drawings to show processes for preparing the thin-film transistor of FIG. 13.
Figure 14B:
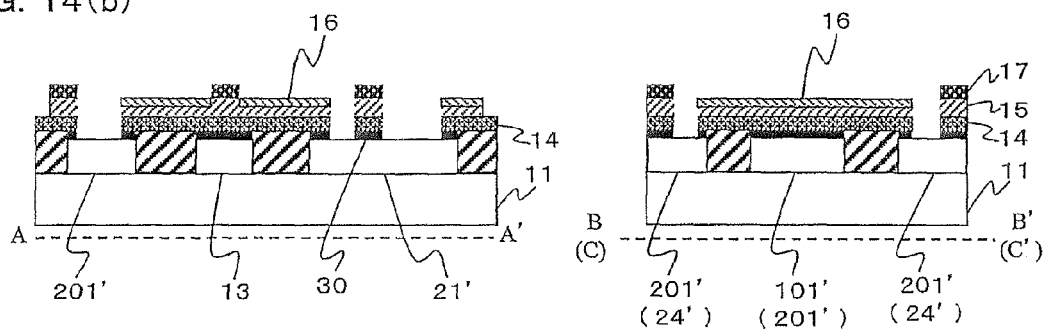

FIG. 13 is a cross-sectional view of a thin-film transistor 10 shown in FIG. 1. This is different from the cross-sectional view of the thin-film transistor of FIG. 8 in that the second light transmission type photosensitive resin 12' is not used. Description will be given below on the process for manufacturing the thin-film transistor. The gate-source line process is the same as the process shown in FIG. 3. The subsequent process for preparing the thin-film transistor is the same as the processes shown in FIG. 9, FIG. 10, and FIG. 11 (*b*). FIG. 14 shows the processes subsequent to the processes shown in FIG. 11 (*b*).

The arrangement shown in FIG. 14 is different from the arrangement of FIG. 11 (*c*) and FIG. 11 (*d*) in that the cap metal 30 is processed by etching as shown in FIG. 14 (*a*), and the second light transmission type photosensitive resin 12' and the resist 110 are removed off as shown in FIG. 14 (*b*).

Figure 15A:
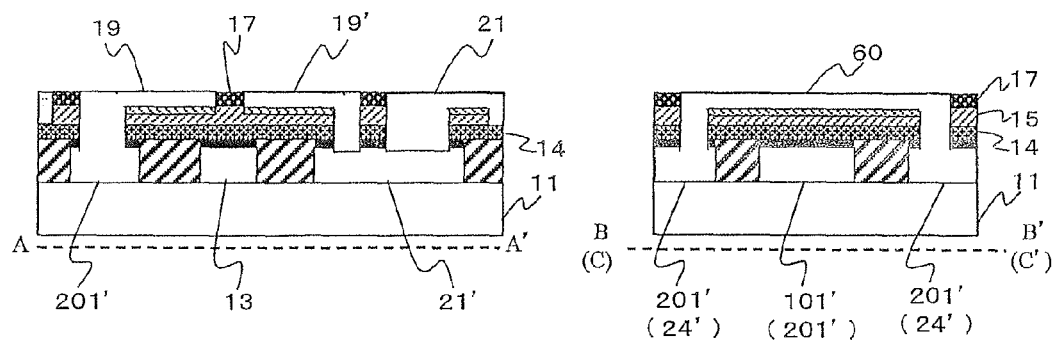
FIG. 15 represents drawings to show processes for preparing the thin-film transistor subsequent to those shown in FIG. 14 and a plan view of the thin-film transistor.
Figure 15B:
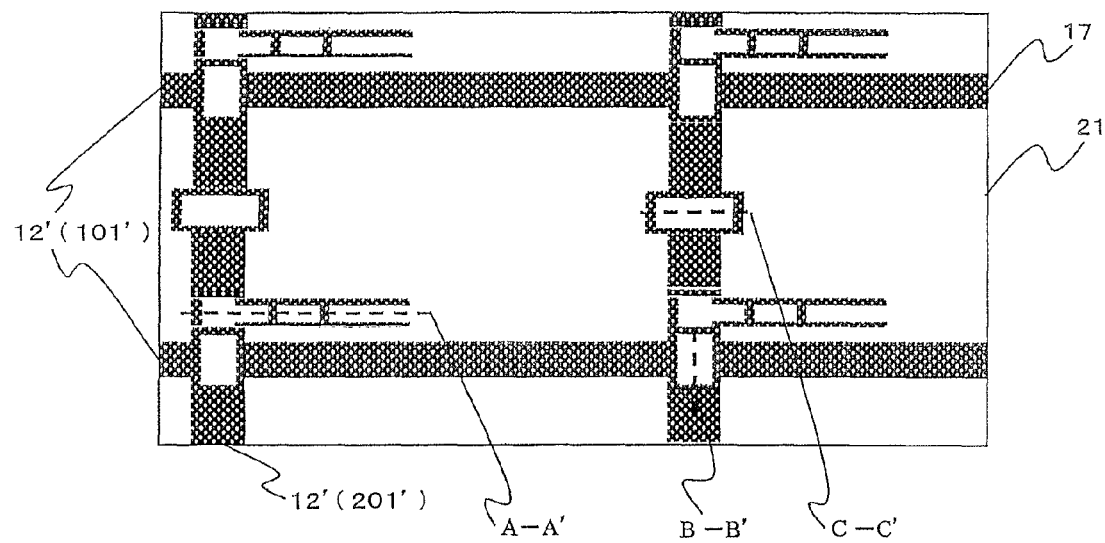

FIG. 15 represents processes for preparing the thin-film transistor subsequent to those of FIG. 14 and the process for preparing pixel electrode. As shown in FIG. 15 (*a*), a source electrode 19, a drain electrode 19', a pixel electrode 21 and a crossing portion connecting line 60 are prepared by ink jet coating. FIG. 15 (*b*) is a plan view.

Embodiment 4

Based on the embodiments as described above, TFT arrays to match full hi-vision (full HD) of 32 type wide and 1920×RGB×1080 pixels were prepared in the specifications of (1)-(3) as given below. As comparative examples, 32 type wide TFT arrays were prepared in the same specifications according to the examples already known.

(1) Source line length: 400 mm; line width: 10 μm; line material: silver (Ag) (specific resistance 2.5 μΩ·cm); film thickness: 0.5 μm).

(2) Crossing portion connecting line length of the source line: 20 μm (1080 points in total); contact area: 10 μm×10 μm (2160 points in total).

(3) Crossing portion connecting line material: [The present invention] silver (Ag) (specific resistance: 2.5 μΩ·cm); [comparative example 1: ] ITO (specific resistance: 100 μΩ·cm).

Resistance value of the straight line was 2 kΩ.

As a result, the source line resistance in the present invention showed an increase of less than 1% compared with the straight source line resistance without crossing portion connecting line. The details of the line resistance of the source line and specific contact resistance are shown in Tables 1 and 2 together with the data of the comparative examples.

TABLE 1

|  | Present invention | Comparative example 1 |
|---|---|---|
| ☐ Straight bus line resistance | 1892 Ω | 1892 Ω |
| ☐ Crossing portion connecting line resistance | 108 Ω | 4320 Ω |
| ☐ Contact resistance | 10.8 Ω | 2160 Ω |
| Source line resistance (☐ + ☐ + ☐) | 2010.8 Ω | 8372 Ω |
| Resistance increasing ratio to straight bus line | 0.5% | 320% |

TABLE 2

|  | Present invention | Comparative example 1 |
|---|---|---|
| Specific contact resistance | $0.05 \times 10^{-8}$ Ωcm$^2$ | $10 \times 10^{-8}$ Ωcm$^2$ |

Embodiment 5

Similarly, TFT arrays to match full hi-vision (full HD) of 32 type wide 1920×RGB×1080 pixels was prepared in the specifications (1) to (3) as given below according to the embodiments as described above. Also, as Comparative Example 2, a mask for pixel and a mask for cross-linking portion were prepared separately so that cross-linking portions of the examples already known (referred as crossing portion connecting line in the present invention) can be connected with silver (Ag), and a 32 type wide TFT array was prepared according to the same specifications.

(1) Source line length: 400 mm; line width: 10 μm; line material: silver (Ag) (specific resistance 2.5 μΩ·cm); film thickness: 0.5 μm.

(2) Crossing portion connecting line length of the source line: 20 μm (1080 points in total); contact area: 10 μm×10 μm (2160 points in total).

(3) Crossing portion connecting line material: [present invention] baked silver (specific resistance: 2.5 μΩ·cm); [Comparative Example 2] sputtered silver (Ag) (specific resistance: 2.5 μΩ·cm).

Resistance value of the straight bus line was 2 kΩ.

As a result, the source line resistance of the present invention showed an increase of less than 1% compared with straight bus line resistance without the crossing portion connecting line. However, in the connection using sputtered silver (Ag), the resistance increased by more than 10%. The details of the source line resistance and specific contact resistance are shown in Tables 3 and 4 together with the data of Comparative Example 2.

TABLE 3

|  | Present invention | Comparative example 2 |
|---|---|---|
| ☐ Straight bus line resistance | 1892 Ω | 1892 Ω |
| ☐ Crossing portion connecting line resistance | 108 Ω | 108 Ω |
| ☐ Contact resistance | 10.8 Ω | 216 Ω |
| Source line resistance (☐ + ☐ + ☐) | 2010.8 Ω | 2216 Ω |
| Resistance increasing ratio to straight bus line | 0.5% | 10.8% |

TABLE 4

|  | Present invention | Comparative example 2 |
|---|---|---|
| Specific contact resistance | $0.05 \times 10^{-8}$ Ωcm$^2$ | $1 \times 10^{-8}$ Ωcm$^2$ |

What we claim is:

1. A method for manufacturing a liquid crystal display device, comprising a thin-film transistor with a gate electrode, a gate insulator, a semiconductor layer, an ohmic contact layer, a source electrode, a drain electrode, and a protective film formed on an insulating substrate, a pixel electrode with the thin-film transistor provided in matrix-like arrangement and connected to the drain electrode via a pixel contact layer, a gate line having the gate electrode, a source line connected to the source electrode, an auxiliary capacity line connected to an auxiliary capacity, and a crossing portion connecting line provided on either one of the gate line or the source line and on the auxiliary capacity line, wherein: the auxiliary capacity line, the pixel contact layer, said gate line, and said source line are formed at the same time on the same layer by ink jet plotting in openings of a light transmission type photosensitive resin where said light transmission type photosensitive resin is formed by patterning using a photomask.

2. A method for manufacturing a liquid crystal display device according to claim 1, wherein: the auxiliary capacity line, the pixel contact layer, said gate line, and said source line are formed at the same time on the same layer by ink jet plotting in openings of a first light transmission type photosensitive resin where said first light transmission type photosensitive resin is formed by patterning; and said source electrode, said drain electrode, said pixel electrode, and said crossing portion connecting line are formed at the same time on the same layer by ink jet coating in openings of a second light transmission type photosensitive resin where said second light transmission type photosensitive resin is formed by patterning using a second photomask.

3. A method for manufacturing a liquid crystal display device according to claim 2, wherein:

said second light transmission type photosensitive resin formed by said second photomask is also used as an opening to prepare the source electrode, the drain electrode, the pixel electrode and the crossing portion connecting line by ink jet plotting, and said second photosensitive resin is also used as an etching mask for forming the thin-film transistor at the same time.

4. A method for manufacturing a liquid crystal display device according to claim 1, wherein: the auxiliary capacity line, the pixel contact layer, said gate line, said source line and said crossing portion connecting line are formed at the same time on the same layer by ink jet plotting in openings of a light transmission type photosensitive resin where said light transmission type photosensitive resin is formed by patterning using a first photomask; and said source electrode, said drain electrode, and said pixel electrode are formed at the same time on the same layer by ink jet coating in openings of a protective film.

* * * * *